(12) United States Patent
Sekar et al.

(10) Patent No.: US 9,087,572 B2
(45) Date of Patent: Jul. 21, 2015

(54) CONTENT ADDRESSABLE MEMORY

(71) Applicant: Rambus Inc., Sunnyvale, CA (US)

(72) Inventors: Deepak Chandra Sekar, San Jose, CA (US); Brent Steven Haukness, Monte Serano, CA (US); John Eric Linstadt, Palo Alto, CA (US); Scott C. Best, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/091,213

(22) Filed: Nov. 26, 2013

(65) Prior Publication Data

US 2014/0153310 A1 Jun. 5, 2014

Related U.S. Application Data

(60) Provisional application No. 61/731,336, filed on Nov. 29, 2012.

(51) Int. Cl.
| | |
|---|---|
| G11C 7/00 | (2006.01) |
| G11C 15/00 | (2006.01) |
| G11C 13/00 | (2006.01) |
| G11C 15/04 | (2006.01) |

(52) U.S. Cl.
CPC ............ G11C 15/00 (2013.01); G11C 13/0002 (2013.01); G11C 15/046 (2013.01)

(58) Field of Classification Search
CPC .................................. G11C 15/04; G11C 5/147
USPC .......................................... 365/49.15, 189.07
See application file for complete search history.

(56) References Cited

U.S. PATENT DOCUMENTS

| | | | | |
|---|---|---|---|---|
| 6,480,406 | B1 * | 11/2002 | Jin et al. ........................ | 365/49.1 |
| 7,050,316 | B1 | 5/2006 | Lin et al. | |
| 7,099,172 | B2 * | 8/2006 | Hu ............................... | 365/49.12 |
| 7,286,381 | B2 * | 10/2007 | de Sandre ................... | 365/49.16 |
| 7,499,303 | B2 * | 3/2009 | Lien et al. .................... | 365/49.1 |
| 7,675,765 | B2 | 3/2010 | Derharcobian et al. | |
| 7,872,889 | B2 | 1/2011 | Lam et al. | |

(Continued)

FOREIGN PATENT DOCUMENTS

WO 2011088526 7/2011

OTHER PUBLICATIONS

Guo, Xiaochen et al.; "Resistive Computation: Avoiding the Power Wall with Low-Leakage, STT-MRAM Based Computing"; University of Rochester, NY; Copyright 2010, ISCA' 10, Jun. 19-23, 2010.

*Primary Examiner* — Michael Tran
(74) *Attorney, Agent, or Firm* — Stolowitz Ford Cowger LLP

(57) ABSTRACT

A content addressable memory can include an array of memory cells having multiple memory elements, such as RRAM elements, to store data based on a plurality resistive states. A common switching device, such as a transistor, can electrically couple a plurality of the multiple memory elements with a matchline during read, write, erase, and search operations. In search operations, the memory cells can receive a search word and selectively discharge a voltage level on the matchline based on the data stored by the memory elements and the search word provided to the memory elements. The voltage level of the matchline can indicate whether the search word matched the data stored in the memory cells. The content addressable memory can potentially have an effective memory cell sizing under $0.5F^2$ depending on the number of layers of memory cells formed over the switching device.

20 Claims, 10 Drawing Sheets

(56) References Cited

U.S. PATENT DOCUMENTS

| | | |
|---|---|---|
| 8,023,299 B1 * | 9/2011 | Gharia .................... 365/49.1 |
| 8,059,438 B2 * | 11/2011 | Chang et al. ............. 365/49.1 |
| 8,107,276 B2 * | 1/2012 | Breitwisch et al. ........... 365/148 |
| 8,120,937 B2 | 2/2012 | Ji et al. |
| 8,195,873 B2 | 6/2012 | Gazit |
| 8,320,148 B1 | 11/2012 | Derhacobian |
| 2010/0095057 A1 | 4/2010 | Li et al. |
| 2010/0110744 A1 | 5/2010 | El Baraji et al. |
| 2010/0226161 A1 * | 9/2010 | Ji et al. .................... 365/49.17 |
| 2011/0051483 A1 * | 3/2011 | Chang et al. ............. 365/49.1 |

* cited by examiner

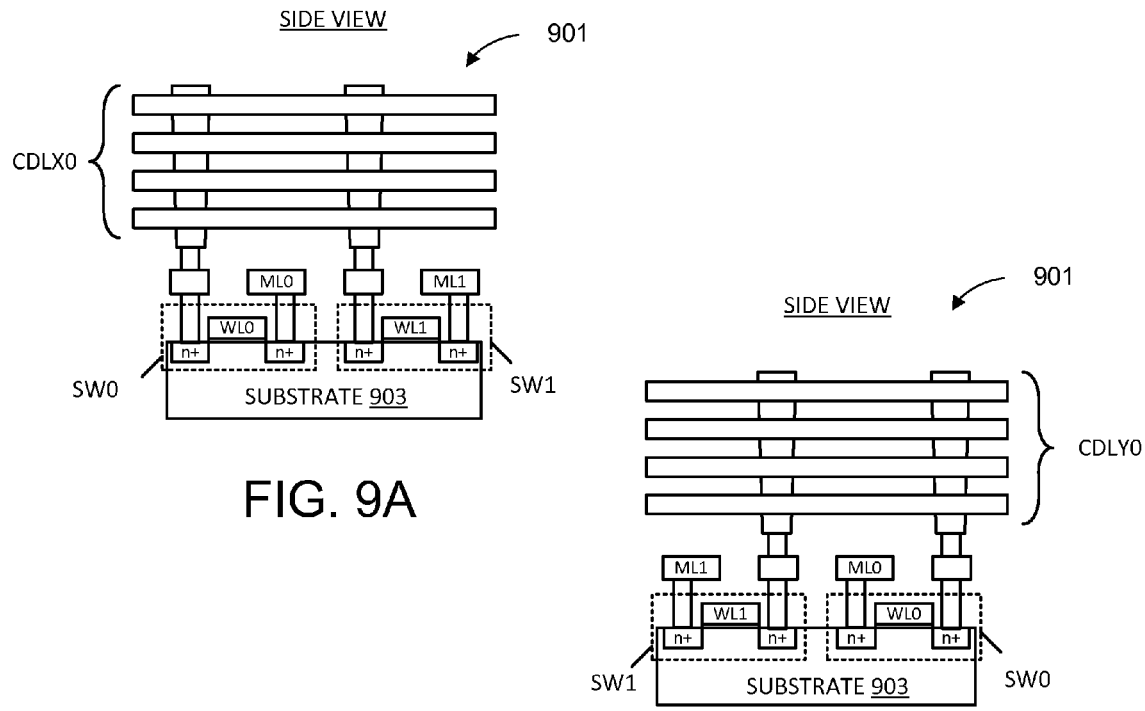
FIG. 9A
FIG. 9B
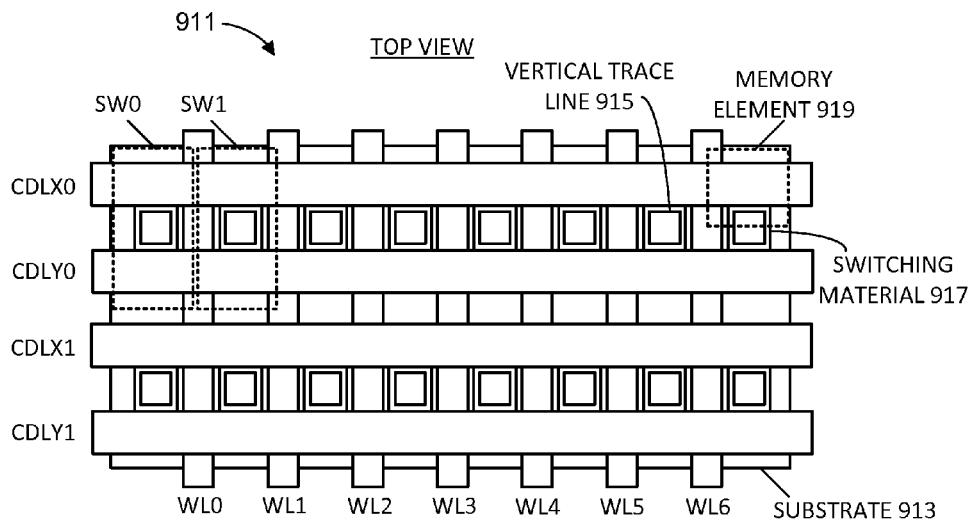
FIG. 9C

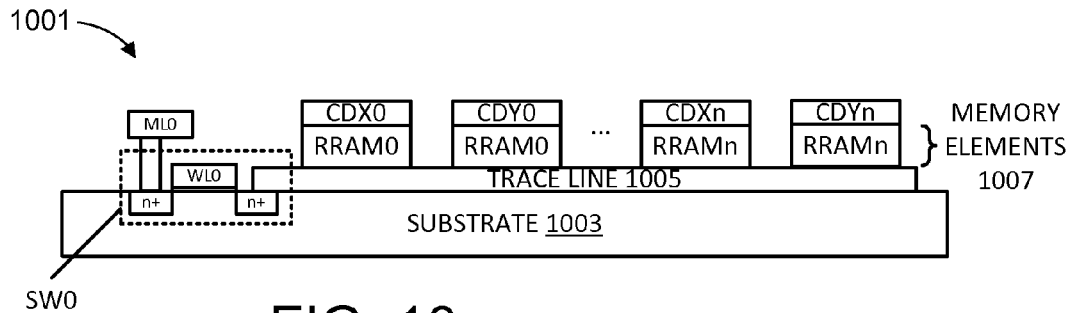
FIG. 10
FIG. 11
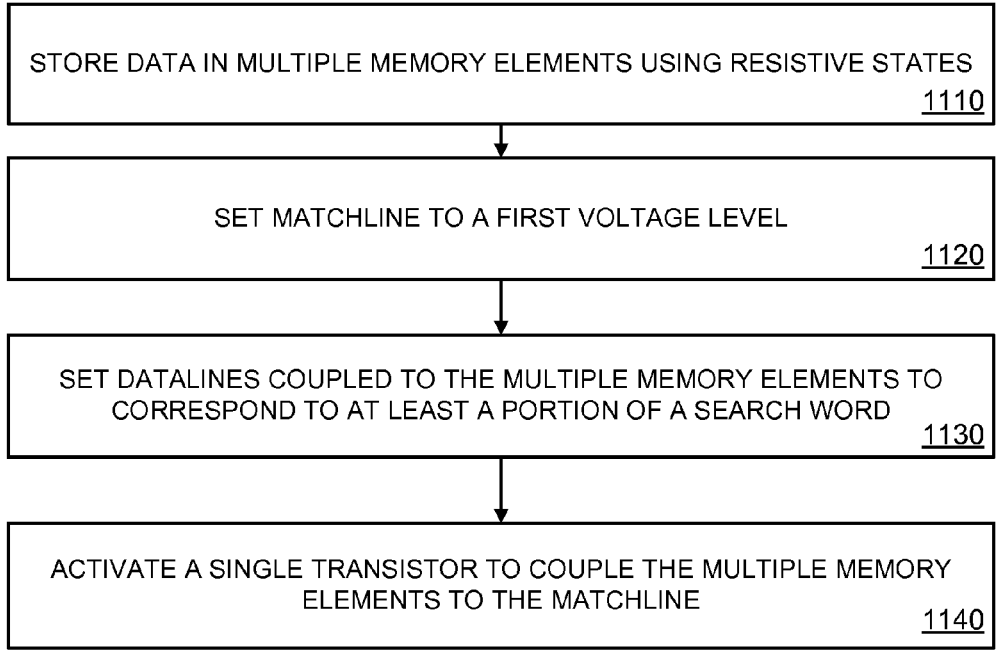

CONTENT ADDRESSABLE MEMORY

RELATED APPLICATIONS

This application is a non-provisional of and claims priority to U.S. provisional application Ser. No. 61/731,336, filed Nov. 29, 2012.

BACKGROUND

A content addressable memory ("CAM") is a memory that receives a search word and searches the memory's storage locations to determine whether any of the locations contains data matching the search word. In many senses, this CAM lookup function is the inverse of the traditional memory read function; data in the form of the search word is received, and the memory outputs an address where the data is found (instead of the traditional read function where an address is received by the memory and the memory outputs data found at the address). CAM architecture is typically such that each memory cell incorporates comparison circuitry, such that the search word can be simultaneously compared against contents of the entire memory. This is to say, a CAM is typically used to provide a very quick lookup function against generally large sets of data, with results obtainable faster than from software-based lookup. Some CAM designs also feature a mask function, where one or more bits of the search word are masked during the search.

One type of CAM of particular interest is a Ternary CAM, or "TCAM." A TCAM typically permits stored data words to be individually masked on a sub-word basis, typically bit-by-bit. That is, in contradistinction with search word masking indicated above, a TCAM permits parts of individual stored data words to be masked during storage, e.g., on a memory row-by-row basis. This feature can be very useful in some applications; for example, for network routers, a TCAM can be used to lookup a port matching a range of IP addresses, where the range would be represented by masked data in an individual storage location, and the address of that individual storage location would be used to retrieve the port. Other applications naturally exist.

A typical TCAM cell 101 is indicated in FIG. 1. It should be assumed that this cell is but one cell in a wide row of cells, with a TCAM memory device having many such rows, forming an array. The heart of the TCAM cell is two separate SRAM storage cells 105 and 107 each of which is used to store opposing logic values representing a stored data bit. For example, if a binary "1" is to be stored in the TCAM cell as a data bit, SRAM storage cell 105 is caused to store a logic "1," while SRAM storage cell 107 is caused to store a logic "0." If the stored data bit is instead a binary "0," a logic "0" is stored in SRAM cell 105, while a logic "1" is stored in SRAM cell 107.

A matchline 103 common to an entire row of TCAM cells including cell 101 runs laterally through cell 101. To write data to the SRAM cells, a wordline pair WLX and WLY is asserted and data to be written is applied to differential bitlines BLX/BLX_ (numeral 109) and BLY/BLY_ (numeral 111). Note that WLX and WLY may be a common physical wordline. To later provide a search function for the depicted cell, the matchline 103 is raised to a charge voltage (e.g., $V_{dd}$). A specific bit of a search word is then presented to the cell (depending on position of the cell within a memory row) via signal lines CDX/CDY (117/119) to compare cell contents to the corresponding bit of the search word; a differential voltage signal is used to represent the particular bit of the search word (generally $V_{dd}$/ground or ground/$V_{dd}$) on these signal lines, dependent on whether the specific search word bit is a binary '1' or '0.' Should the SRAM cell contents (i.e., signals "X" and "Y") represent a mismatch with the corresponding signals (CDX/CDY), then this mismatch causes a respective pair of FETs to both conduct and thereby discharge the matchline 103. For a given row in the TCAM device, if no TCAM cell in the row discharges the matchline, then the matchline remains at its sense voltage and therefore represents a match. In the TCAM cell of FIG. 1, both SRAM storage cells 105 and 107 can also be written-to to both store a logic "0" to represent a mask indication, which produces a match result for the TCAM cell during comparison irrespective of the applied search word (i.e., by preventing any discharge of the matchline by the particular TCAM cell). The matchline 103, the various bitlines 109 and 111 and the wordlines 113 and 115 are also used to provide conventional memory device operations, including writes to the cell, data reads, and other operations as appropriate.

Present applications of both CAMs and TCAMs are limited due to large cell size and, consequently, large device size; CAMs and TCAMs also suffer from very high power consumption relative to conventional memory. For example, conventional CAM cell designs such as the one seen in FIG. 1 may have twenty or more transistors and occupy a space greater than $80F^2$ (i.e., 80 times minimum feature cell size in area). Each transistor (or other component) also generally consumes power during normal cell operations (e.g., read, write or other operations). As a result, large (capacity) CAMs and TCAMs can be expensive to operate, especially for applications where software presents a timewise-manageable alternative. That is to say, CAM and TCAM devices are typically of small capacity, are expensive, or are both small and expensive. Because typical TCAM cell designs incorporate a mask function at the subword level, TCAM devices are typically even more expensive and limited in application than typical CAM designs. Despite these limitations, CAMs and TCAMs are still frequently utilized in applications where fast lookup functions against large storage capacities are desired, especially for internet routers, video and audio applications, regression and curve analysis, and other specialized forms of computational analysis.

DETAILED DESCRIPTION OF DRAWINGS

FIGS. 9A, 9B, 9C are block diagrams showing views of an example array of memory cells, e.g., as shown in FIG. 3A, that can be used in a content addressable memory.

FIG. 10 is a block diagram example showing a side view of an example array of memory cells, e.g., as shown in FIG. 3A, that can be used in a content addressable memory.

FIG. 11 is a flow chart illustrating an example process for using a memory cell, e.g., as shown in FIG. 3A.

DETAILED DESCRIPTION

A content addressable memory can include an array of memory cells arranged in a row-column format, which can store a plurality of data words, for example, one per row of the memory cells. The content addressable memory can compare a search word against the data words stored by the array and, when a match is found between a data word and the search word, the content addressable memory can output an address corresponding to the data word that matches the search word. As discussed, above, prior content addressable memory devices consumed a large footprint on a semiconductor substrate, having an effective memory cell size of $80F^2$, where F is a minimum feature size of those memory devices. This application discloses configurations of an array of memory cells having a significantly smaller footprint and potentially lower power consumption than some conventional content address memory designs. Embodiments are shown and described below in greater detail.

Figure 1:
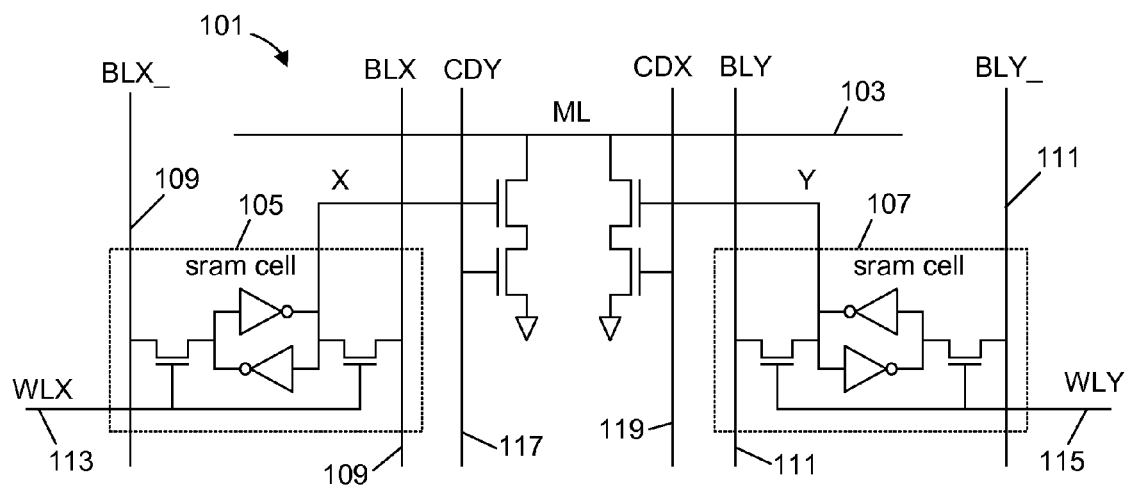
FIG. 1 is a block diagram showing a prior art ternary content addressable memory (TCAM) cell.
Figure 2:
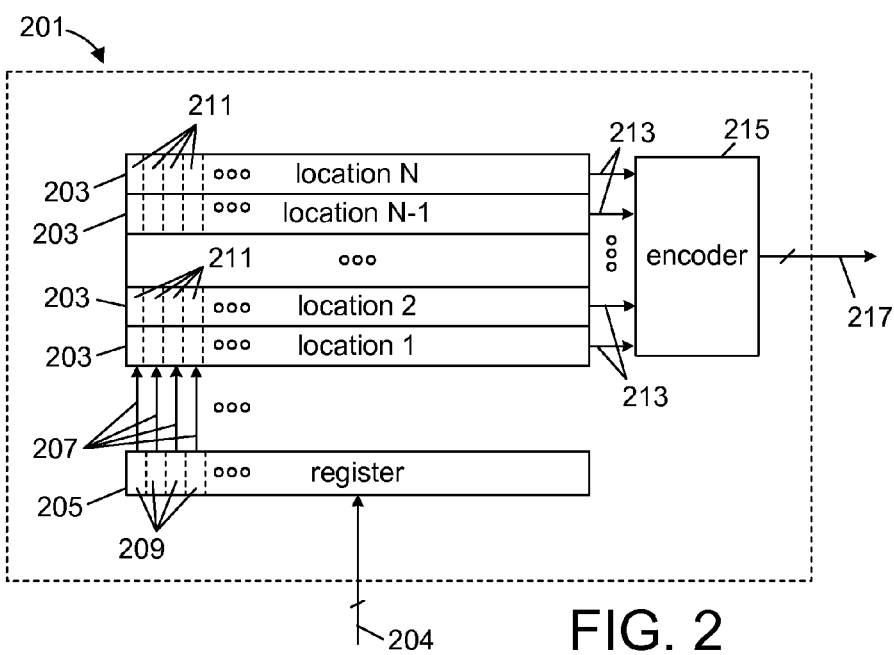
FIG. 2 is a block diagram example of a content addressable memory.

FIG. 2 is a block diagram example of a content addressable memory ("CAM") 201. The memory array can be arranged as a matrix of memory cells 211, organized into rows and columns. Each row can provide a storage location 203 for a data word, with the CAM device having an aggregate of "N" rows or equivalently N storage locations. Each of "j" columns represents a particular bit position for each row. Like conventional memory devices, the CAM device 201 possesses input/output ("IO") circuitry, not shown in FIG. 2, to receive commands from a master along a command bus and to receive and provide data via a data bus 204. A write command can cause the CAM device to store data provided via the data bus 204 at a row address specified by the command, and a "read command" causes the CAM device to provide data found at the row address specified by the command to the master, again, via the data bus 204.

Being as it is a CAM device, memory device command logic can also process a search command. A search command can cause the memory device to at-once compare all of its storage locations (or one or more designated subgroups of storage locations) to a specific search word provided to the memory device via the data bus. The bitlines for the CAM device can be set to respective states matching the specific search word, and the matchline associated with each individual row is discharged "quickly" dependent on whether or not the row stores data matching the search word. The term "at-once" is used to mean that the comparison occurs concurrently and substantially simultaneously for an array, e.g., for all rows at the same time, or sequentially, for blocks of rows in close succession, e.g., with blocks of storage locations being sequentially compared to the search word in close succession, with each block performing a concurrent comparison of its constituent rows. A result returned by this command can be the row address of a storage location having the data that matches the search word, or an indication that no memory address has data matching the search word.

To provide a typical implementation example, a CAM device can have a capacity of 1024 K rows, each row 160 bits long. Other designs are of course possible. The CAM can have a register 205; responsive to a search command, the CAM device stores a provided search word into this register. The register is in turn coupled to the compare datalines 207 of the array, and the search command causes compare dataline driver logic to impose on the compare datalines states representing individual bits 209 of the search word. Wordline driver logic in turn activates the wordlines of the array to enable the comparison. The compare datalines 207 cross respective memory cells 211 in each of the N rows, with a comparison between the search word and each of the N rows occurring substantially simultaneously for the entire device. Once again, other designs are also possible. The register 205 and compare datalines 207 are also used for (i) writing data into the CAM device (e.g., set or reset of the individual RRAM elements of each memory cell in an addressed row to write a data bit or mask indication), (ii) erasing data in the CAM device (e.g., block-based or row-based functions that set RRAM elements to default values for each cell), (iii) retrieval of data from an addressed row, and (iv) the search function, as just mentioned.

To enable the search function, each memory cell 211 includes circuitry that supports built-in comparison. As part of this circuitry, each of the N rows of the array also has a per-row matchline 213 that will provide a voltage output representing, at an appropriate sampling point, relative to an appropriate threshold, whether a match exists or not between a given search word and associated CAM row. The matchlines for all N rows couple to an encoder 215, which determines the address of any matchline showing correspondence of the data stored in the row with the search word. The encoder typically provides a multi-bit output 217 indicating a single row address if one or more matches are found or that none of the N rows provides a match. An illegal address value can be returned in the event of no match. Alternatively, a match/no match state can be indicated by a separate signal or a register flag. In a typical embodiment, the address is output according a priority that reconciles multiple matches, if they exist. For example, the priority can be configured to pick the lowest memory address with data matching the search word, or to output an address according to another desired scheme. Designs that output multiple addresses in the event of multiple matches are also possible.

As will be further described below, optional embodiments of the CAM device 201 support ternary CAM (TCAM) functionality, where one or more bits of a storage word are selectively masked by the device. This mask function is obtained by causing the cell to store a "do not care" state that will produce a match result for that cell irrespective of the search word. This functionality should not be confused with a mask function which can be applied on a global basis to the search word, e.g., where the memory array is controlled to not compare certain rows or columns in the array with the search word. Some embodiments of CAM device 201 provide this latter functionality; some embodiments also provide a feature where individual rows, or blocks of rows, can be made the focus of search comparison or can be made exempt from comparison. Also, in some embodiments, this TCAM functionality is supported throughout a row on a bit-by-bit basis, with every memory cell in the CAM being based on a two-RRAM design.

Figure 3A:
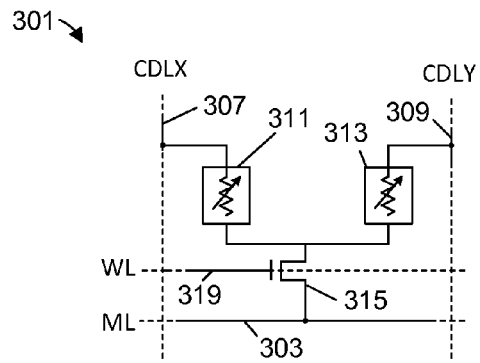
FIG. 3A is a schematic showing an example configuration of a memory cell that can be used in the embodiment of FIG. 2.

FIG. 3A is a schematic showing an example configuration of a memory cell 301 that can be used in the embodiment of FIG. 2. Each cell of the array of FIG. 2 can be a repeated instance of this cell design, or alternatively, only a subset of cells, for example, specific rows or columns, can be based on this design. Referring to FIG. 3A, the memory cell 301 can be a ternary content addressable memory cell, for example, including multiple memory elements 311 and 313 to store data, such as at least a portion of a data word, with a plurality of resistive states. In some embodiments, each of the memory elements 311 and 313 can store a binary value based on their resistive state, and the combination of the two binary values stored by the memory elements 311 and 313 of the memory cell 301 can represent a bit of a data word.

The memory elements 311 and 313 can be resistive random access memory (RRAM) elements or other types of memory elements capable of storing data with a resistive state change. In some embodiments, instead of using RRAM elements, other types of nonvolatile or volatile memory elements can be used. Although known by a variety of names, many forms of "bistable" elements have properties where resistance change is a manifestation of change in physical material properties. For example, RRAM, magnetic random access memory (MRAM), phase change random access memory (PCRAM), nanowire RAM, and similar designs all operate based on similar state change principles where the current flow through the material (or equivalently, voltage drop seen across the material) changes depending on material state. Also, there are many different types of devices that are known as "RRAM." The term "RRAM" as used herein includes any memory with memory elements that include resistance-switching material that can be cycled between high- and low-resistance states. For example, RRAM elements can include resistance-switching materials such as phase-change materials, insulating materials, solid electrolyte materials, and organic materials. Some examples of resistance-switching insulating materials include $TiO_2$, NiO, $SrZrO_3$, $SrTiO_3$, $ZrO_2$, MO, MgO, $WO_3$, and $HfO_2$. Examples of resistance-switching electrolyte materials include $GeXSe_{1-x}$, $GeS_2$, $Cu_2S$, $Ag_2S$, and $SiO_2$. Of course, other materials can also be used. Some types of RRAM may also be referred to as "CBRAM" (Conductive Bridging RAM) or ReRAM.

Note that the term "bistable" as used in this disclosure indicates that a structure has two relatively stable states, i.e., that can be used to store information and then, a time later, be sensed to recover the stored information. As this definition implies, these states can be stable for long duration, such that refresh operations are not necessary, or for only a short duration, for example, when implemented as a form of dynamic random access memory, with refresh operations being used to extend state retention.

In some embodiments, the memory cell can store a bit of the data word using high and low resistance states, where a low resistance state corresponds to a "set" value. That is, in this embodiment, the data written into each individual memory cell can be represented by the resistance states of the RRAM elements as follows:

TABLE 1

| R-states | Stored info. |
| --- | --- |
| {low, high} | "1" |
| {high, low} | "0" |
| {high, high} | X, ("don't care") |
| {low, low} | Typically not used |

Note the optional support of TCAM functionality represented by the "X" or "don't care" state in Table 1, above. The data-bit-to-RRAM-state mapping seen in Table 1 allows any bit of any stored data word to be masked during storage, for example, to represent one or more ranges of values, with the corresponding bit of a search word nevertheless being applied to other rows. For example, this structure might permit storage of a data range of 11-15, with a match result produced for any specific search word within this range. Using the example of a network router, the storage location can represent a range of Internet Protocol (IP) addresses, such that when a system seeks a port associated with a specific IP address within this range, the CAM device would return a CAM address that prompts selection of a port common to a range of IP addresses.

The memory elements 311 and 313 can be coupled between compare datalines CDLX 307 and CDLY 309, respectively, and a switching device 315, such as a transistor. The switching device 315 can selectively couple the memory elements 311 and 313 to a matchline 303, for example, in response to signaling on a wordline 319. Both the matchline 303 and the wordline 319 can be shared by other memory cells in a given row of memory cells. The compare datalines CDLX 307 and CDLY 309 can serve as column access lines for a single column of a memory array, and so define a particular bit storage position for each row of the array (e.g., least significant bit). The compare datalines CDLX 307 and CDLY 309 and the matchline 303 can also be used during search, read, write and other memory functions as appropriate, to aid in the performance of these functions. Embodiments of the write and search operations of the memory cell will be described below in greater detail.

Since multiple resistive memory elements 311 and 313 can couple to the matchline 303 through a single switching device 315, this memory cell can be said to constitute a one-transistor multiple-resistor "1TMR" structure. That is to say, a common switching device 315 can be used with multiple resistive memory elements 311 and 313 for data storage and comparison operations. Since these memory elements 311 and 313 can be formed in a layer above the switching device 315 and within the footprint of the switching device 315 on a semiconductor substrate, the effective memory cell size can be reduced at least to the sizing of the switching device 315, for example, $8F^2$, where F is a minimum feature size.

Figure 3B:
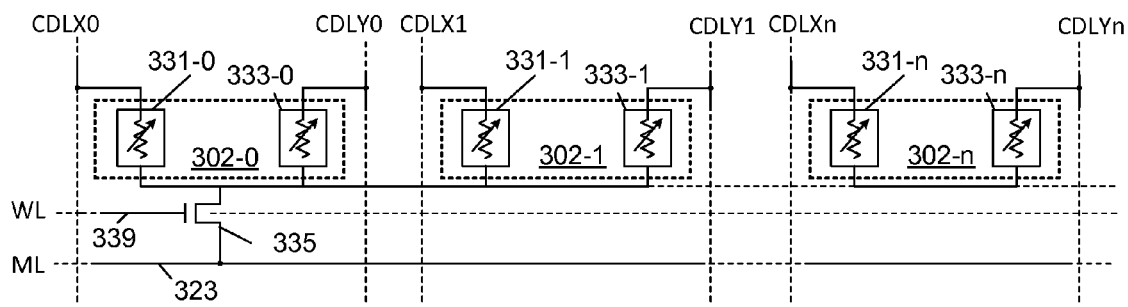
FIG. 3B is a schematic showing an example configuration of multiple memory cells that can be used in the embodiment of FIG. 2.

FIG. 3B is a schematic showing an example configuration of multiple memory cells 302-0 to 302-n that can be used in the embodiment of FIG. 2. Referring to FIG. 3B, the memory cells 302-0 to 302-n can be similar to memory cell 301 shown and described above with reference to FIG. 3A, except the memory cells 302-0 to 302-n can share a common transistor 335 to couple the memory elements 331-0 to 331-n and 333-0 to 333-n of the memory cells 302-0 to 302-n, respectively, to the matchline 323.

Since multiple memory elements 331-0 to 331-n and 333-0 to 333-n can couple to the matchline 303 through a single switching device 335, these memory cells 302-0 to 302-n can be said to constitute a one-transistor multiple-resistor "1TMR" structure. That is to say, a common switching device 335 can be used with multiple resistive memory elements 331-0 to 331-n and 333-0 to 333-n for data storage and comparison operations. In some embodiments, these memory elements 331-0 to 331-n and 333-0 to 333-n can be formed in one or more layers above the switching device 335 and within the footprint of the switching device 335 on a semiconductor substrate. When the memory elements 331-0 to 331-n and 333-0 to 333-n are formed above the switching device 335, the effective memory cell size can be reduced based on a number of the memory cells 302-0 to 302-n formed in the one or more layers above the switching device 335. For example, when there are 16 memory cells 302 formed above the switching device, the effective memory cell size can be $0.5F^2$ or $(8F^2$ footprint size of the switching device 335/16 memory cells), where F is a minimum feature size on the memory device.

In some embodiments, when more than two memory elements 331-0 to 331-$n$ and 333-0 to 333-$n$ couple to the matchline 323 through a single switching device 335, non-linear devices (not shown), such as diodes or other devices having non-linear electrical characteristics, can be coupled in series with one or more of memory elements 331-0 to 331-$n$ and 333-0. These non-linear devices can help prevent forming sneak leakage path to the matchline 323 that is attempting to discharge due to a mismatch in at least one of the memory elements 331-0 to 331-$n$ and 333-0 to 333-$n$. Embodiments of the sneak leakage path will be described below in greater detail.

Figure 3C:
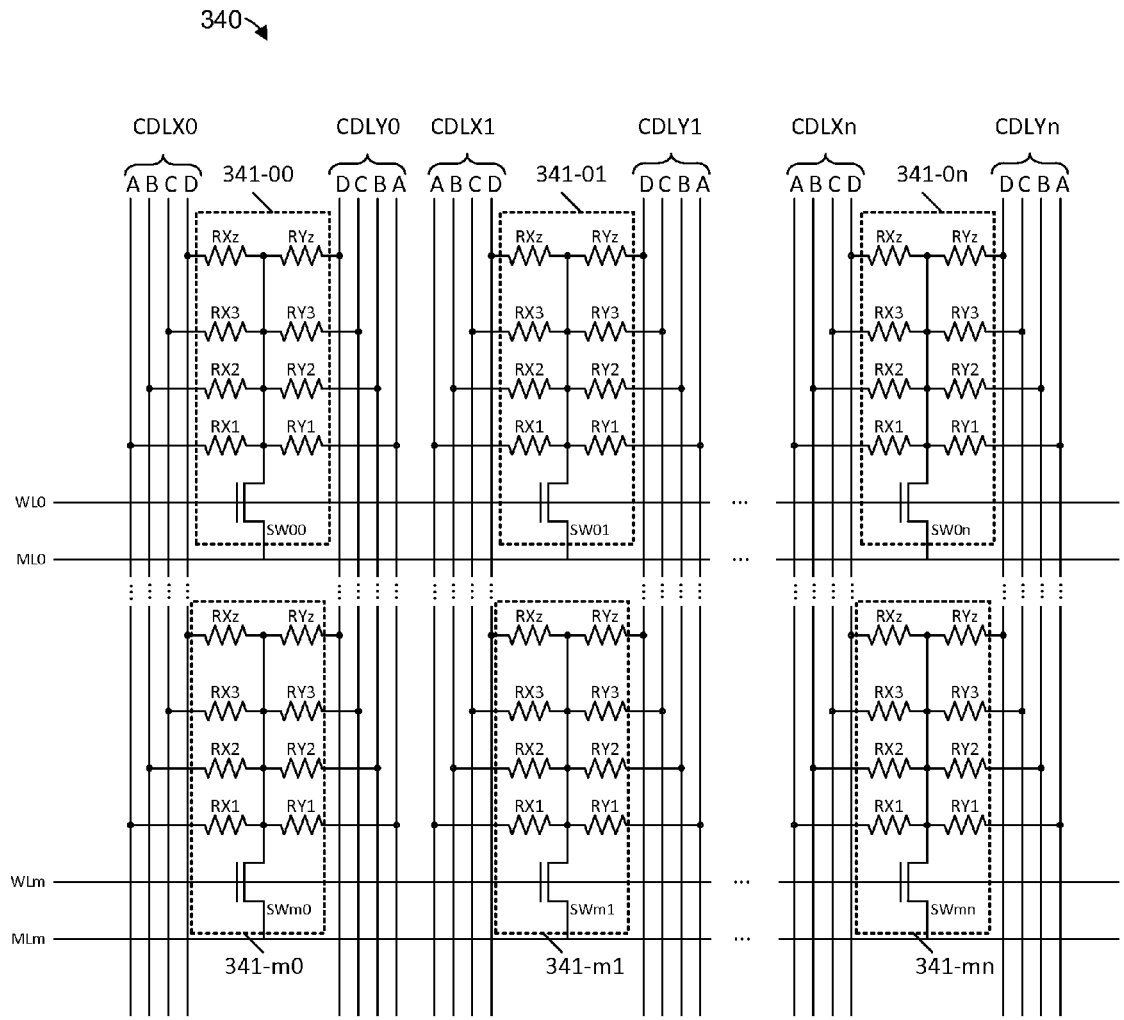
FIG. 3C is a schematic showing an example configuration of an array of memory cells that can be used in the embodiment of FIG. 2.

FIG. 3C is a schematic showing an example configuration of an array of memory cells 340 that can be used in the embodiment of FIG. 2. Referring to FIG. 3C, the array of memory cells 340 can include multiple memory cell subsets 341-00 to 341-$mn$, each of which can operate similarly to the configuration of multiple memory cells 302-0 to 302-$n$ shown and described above in FIG. 3B. The memory cell subsets 341-00 to 341-$mn$ can each include multiple memory cells RX1-RXz and RY1-RYz. When the array of memory cells 340 implements a ternary content addressable memory, pairs of the memory elements RX1-RXz and RY1-RYz can implement the memory cells. For example, RX1 can pair with RY1, RX2 can pair with RY2, etc, to for z number of memory cells in the memory cell subsets 341-00 to 341-$mn$. When the array of memory cells 340 implements a content addressable memory, each memory element RX1-RXz and RY1-RYz can implement a separate memory cell. In another example, the memory elements RX1-RXz and RY1-RYz can be grouped into sets of four and implement a one-hot encoding scheme to store multiple bit values. Embodiments of the one-hot encoding scheme will be described below in greater detail. Although FIG. 3C shows each memory cell subset 341-00 to 341-$mn$ including a same number of memory cells, in some embodiments, this need not be the case, as any number of memory cells can be included in the memory cell subsets 341-00 to 341-$mn$.

Each of the memory cell subsets 341-00 to 341-$mn$ can include a corresponding switching device SW00-SWmn to couple the multiple memory cells to a corresponding matchline ML0-MLm during read, write, erase, and search operations, for example, in response to signaling on corresponding wordlines WL0-WLm. In some embodiments, the memory cell subsets 341-00 to 341-$mn$ can share the wordlines WL0-WLm and matchlines ML0-MLm with other memory cell subsets located in a common row of the array 340. For example, memory cell subsets 341-00, 341-01 and 341-0$n$ can be coupled to wordline WL0 and matchline ML0, while memory cell subsets 341-0$m$, 341-1$m$, and 341-$mn$ can be coupled to wordline WLm and matchline MLm.

Each of the memory cell subsets 341-00 to 341-$mn$ can be coupled to compare datalines CDLX0-CDLXn and CDLY0-CDLYn, respectively. In some embodiments, the memory cell subsets 341-00 to 341-$mn$ can share the compare datalines CDLX0-CDLXn and CDLY0-CDLYn with other memory cell subsets located in a common column of the array 340. For example, memory cell subsets 341-00 and 341-m0 can be coupled to compare datalines CDLX0 and CDLY0, memory cell subsets 341-01 and 341-m1 can be coupled to compare datalines CDLX1 and CDLY1, and memory cell subsets 341-0$n$ and 341-$mn$ can be coupled to compare datalines CDLXn and CDLYn. The memory cell subsets 341-00 to 341-$mn$ can utilize the compare datalines CDLX0-CDLXn and CDLY0-CDLYn to perform read, write, erase, and search operations with the memory cells in the memory cell subsets 341-00 to 341-$mn$.

Figure 4:
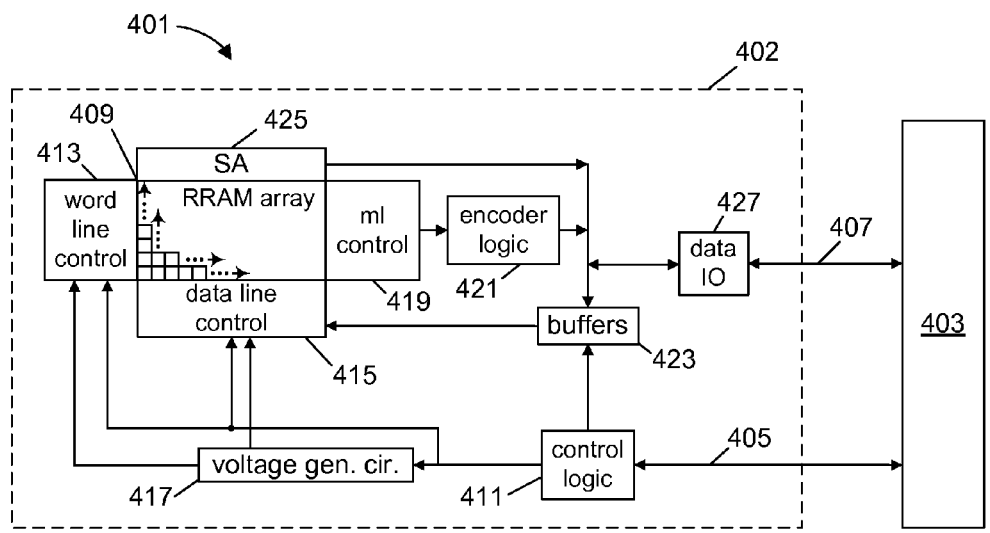
FIG. 4 is a block diagram example of a system including a content addressable memory.

FIG. 4 shows a memory system 401, including a CAM integrated circuit device ("IC") 402 and a memory controller 403. Memory controller 403 commands write, erase and read operations for CAM IC 402, as well a search function. In some embodiments, the memory controller 403 can be embodied in a general purpose CPU, a DSP chip, as a memory board-specific microprocessor, all examples of integrated circuit devices ("ICs"). Communications between ICs can be effectuated using circuit board traces 405 and 407, which respectively denote a command and address link ("CA" or "CA bus") and a data link ("DQ" or "data bus"). Each of these links can include a number of individual signaling paths, with each word or packet transmission over the link encoded in either a multipath (serial or parallel) or single path, serial manner. Each CA and DQ path may further be either single-ended or differential, point-to-point or multidrop, or configured in any other suitable manner. The various links can be used in part to control management of data within RRAM memory array 409 and exchange of that data with the memory controller IC. In other embodiments, CAM 402 resides on a common circuit with a controller, microprocessor, floating point gate array, etc., that accesses CAM 402. In such cases, data I/O and command/address pass to the circuit on internal chip busses.

As shown in detail within the CAM IC 402, CA transmissions can be received by control logic 411. The control logic 411 can regulate timing of all of the various tasks described below, and can be responsible for sequencing the device operations that respond to commands and direct data to and from specific memory addresses. As alluded to previously, commands can be used to trigger a number of different operations. Write operations typically involve setting or resetting individual RRAM elements based on data received via the DQ path 407. Erase operations relate to row-, block- or device-based set and reset of RRAM elements according to a default pattern, without provided data. Data read operations can involve the provision of data from an address-specified row via the DQ path 407 to the memory controller. Other types of commanded operations can include power mode operations, calibration operations, refresh operations or potentially other operations. When a particular command involves access to the RRAM array 409, the control logic 411 can access word line control logic and dataline control logic, 413 and 415, respectively, to control the array as will be explained below. In concert with these activities, the control logic 411 also can trigger generation of appropriate voltages from voltage generation circuitry 417, with these voltages being provided to the wordline control logic and dataline control logic, 413 and 415 to assist with operations involving the array 409. In this context, the voltage generation circuitry 417 can provide the supply of all necessary voltages and connections, such $V_{dd}$, a connection to GND, $V_{wl}$, $V_{set}$, $V_{reset}$, and other voltages and references as described below. Depending on the particular command, access to the RRAM array 409 also can involve the use of matchline control circuit 419 and encoder logic 421 and/or buffers 423. The matchline control circuit includes driving and detection circuitry for read and write operations, as well as for matchline charge during search and compare operations.

To provide an example, if the controller commands a search in conjunction with a search word transmitted via the data bus, the search word can be stored in buffers 423 and used by dataline logic 415 in controlling the various compare datalines of the array 409. The control logic can enable all matchlines through the matchline control circuit 419. In concert with these actions, all wordlines for the rows being searched can be raised to an appropriate enabling voltage. Matchline output is then provided to encoder logic 421 which, in response, outputs a null match indication or a row address indication through data IO 427.

If the command involves the writing of data into a row, data received via DQ link 407 and data IO 427 can be first stored in one of buffers 423. The wordline control logic 413 and dataline control logic 415 can direct the wordlines and datalines to effectuate this writing of data.

The CAM device is controlled to perform any other necessary or appropriate operations, including the operations expected of more traditional memory devices. For example, in some embodiments, it may be necessary to refresh memory row contents in order to retain data more than a threshold time. Refresh operations are well understood and will not be described here, other than to note that such operations typically involve reading a row of data and rewriting that data back into the particular row of memory. Other operations without limitation can involve various calibration operations, wear leveling, atomic operations, or nearly any other type of operation suitable for a memory device.

Figure 5A:
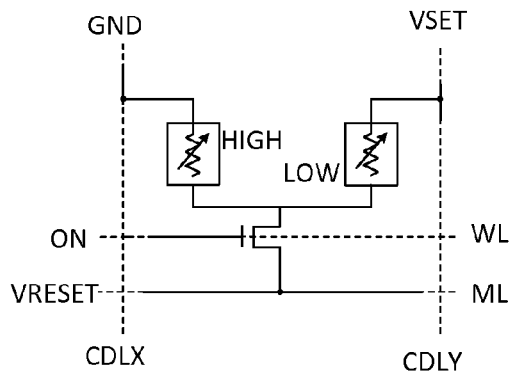
FIGS. 5A, 5B, 5C are block diagrams showing example write operations for a memory cell, e.g., as shown in FIG. 3A.
Figure 5B:
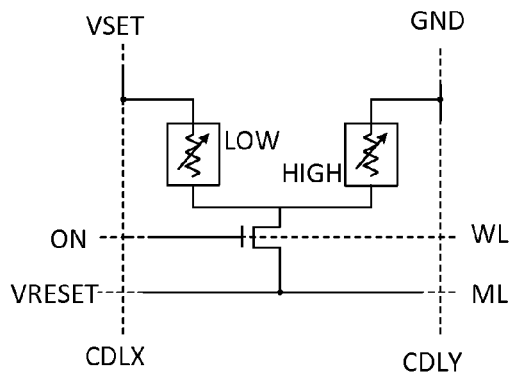
Figure 5C:
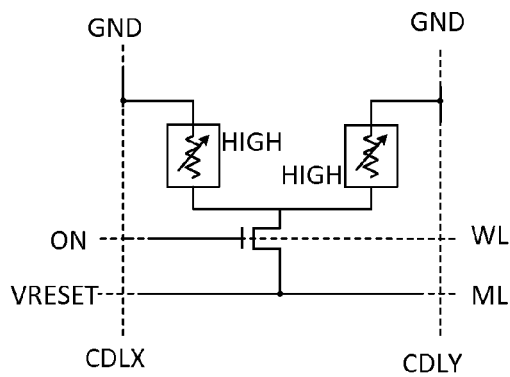

FIGS. 5A-5C are block diagrams showing example write operations on a memory cell having a "1TMR" structure. The memory cells shown in FIGS. 5A-5C can be implemented as a ternary content addressable memory similar to some of the embodiments shown and described above with reference to FIGS. 3A-3C. Referring to FIG. 5A, during a write operation to store a bit value of "0" to a memory cell, a matchline ML can be charged to a reset voltage $V_{RESET}$, voltages corresponding to the bit value can be provided to the memory elements over corresponding compare datalines CDLX and CDLY, and a voltage on a wordline WL can be set to turn on a switching device electrically coupling the memory elements to the matchline ML. Since a bit value of "0" can be stored in the memory cell as a combination of a first memory element set in a high resistive state (shown in the left in FIG. 5A) and a second memory element set in a low resistive state (shown in the right in FIG. 5A), a voltage on the compare dataline CDLX can correspond to a ground voltage GND, while a voltage on the compare dataline CDLY can correspond to a set voltage $V_{set}$. The magnitude of the voltage difference between the ground voltage GND and the reset voltage $V_{RESET}$ on the matchline ML can cause the first memory element to be set in a high resistance state, while the magnitude of the voltage difference between the set voltage $V_{set}$ and the reset voltage $V_{RESET}$ on the matchline ML can cause the second memory element to be set in a low resistance state. After the write operation has been performed, the voltage on the wordline WL can transition to a lower level to turn off the switching device.

It should also be noted that, in the description above, a voltage difference across a memory element also can be used for reading data. Notably, with RRAM elements, it may be typically desired to read cell state using a smaller voltage than that used for writing, e.g., to avoid read disturb when servicing either read or search commands. This goal can be achieved in a number of ways, for example, driving write operations using relatively strong currents but performing data reads using much smaller current flows.

An optional erase operation for a row of cells may be included that is similar to a write operation just described, except that data is typically not provided to the content addressable memory from an external source; rather, the content addressable memory can be controlled to write all memory cells (for a row or block) to a predetermined value (e.g., a logic "1" or "0"). To implement this function in a 2-RRAM element design, alternating compare datalines CDLX and CDLY are coupled to $V_{set}$ or GND, respectively, with the matchline being set to $V_{reset}$ in the manner described earlier. In some embodiments, the memory elements can be oriented in opposite directions, in which case the set and reset voltages would be reversed.

Referring to FIG. 5B, during a write operation to store a bit value of "1" to a memory cell, a matchline ML can be charged to a reset voltage $V_{RESET}$, voltages corresponding to the bit value can be provided to the memory elements over corresponding compare datalines CDLX and CDLY, and a voltage on a wordline WL can be set to turn on a switching device electrically coupling the memory elements to the matchline ML. Since a bit value of "1" can be stored in the memory cell as a combination of a first memory element set in a low resistive state (shown in the left in FIG. 5B) and a second memory element set in a high resistive state (shown in the right in FIG. 5B), a voltage on the compare dataline CDLX can correspond to a set voltage $V_{set}$, while a voltage on the compare dataline CDLY can correspond to a ground voltage GND. The magnitude of the voltage difference between the set voltage $V_{set}$ and the reset voltage $V_{RESET}$ on the matchline ML can cause the first memory element to be set in a low resistance state, while the magnitude of the voltage difference between the ground voltage GND and the reset voltage $V_{RESET}$ on the matchline ML can cause the second memory element to be set in a high resistance state. After the write operation has been performed, the voltage on the wordline WL can transition to a lower level to turn off the switching device. In some embodiments, the memory elements can be oriented in opposite directions, in which case the set and reset voltages would be reversed.

Referring to FIG. 5C, during a write operation to store a "data mask" to a memory cell, a matchline ML can be charged to a reset voltage $V_{RESET}$, voltages corresponding to the bit value can be provided to the memory elements over corresponding compare datalines CDLX and CDLY, and a voltage on a wordline WL can be set to turn on a switching device electrically coupling the memory elements to the matchline ML. Since a "data mask" can be stored in the memory cell as a combination of a first memory element set in a high resistive state (shown in the left in FIG. 5C) and a second memory element set in a high resistive state (shown in the right in FIG. 5C), voltages on the compare datalines CDLX and CDLY can both correspond to a ground voltage GND. The magnitude of the voltage difference between the ground voltage GND and the reset voltage $V_{RESET}$ on the matchline ML can cause the first and second memory element to be set in a high resistance state. After the write operation has been performed, the voltage on the wordline WL can transition to a lower level to turn off the switching device. In some embodiments, the memory elements can be oriented in opposite directions, in which case the set and reset voltages would be reversed.

Although FIGS. 5A-5C describe writing both memory elements in a multiple cell during a single operation, in some embodiments, the process for writing the memory elements in the memory cell can be performed in multiple serial operations. For instance, during a first stage a first memory element can be written, while the second memory element can be held constant, and then during a second stage the second memory element can be written, while the first memory element can be held constant. In some embodiments, the first or second memory elements can be held constant by setting the compare dataline voltage to the reset voltage $V_{RESET}$. By performing multiple stage write operations it may be possible to utilize a lower set voltage $V_{set}$.

Figure 6A:
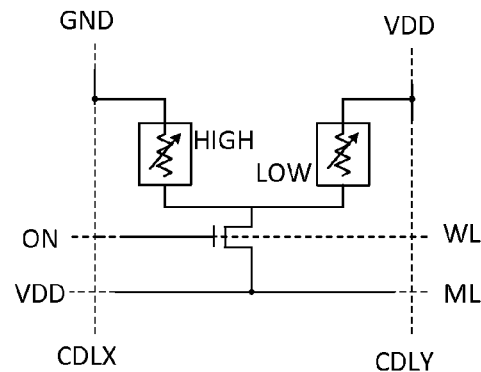
FIGS. 6A, 6B, 6C are block diagrams showing example search operations for a memory cell, e.g., as shown in FIG. 3A.
Figure 6B:
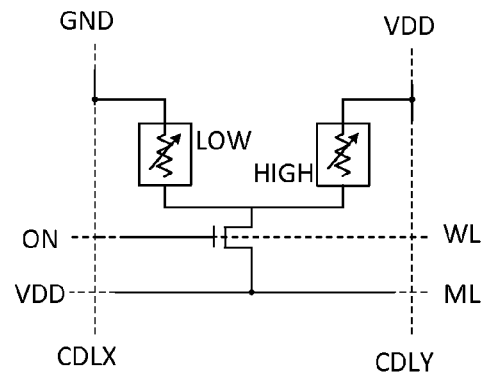
Figure 6C:
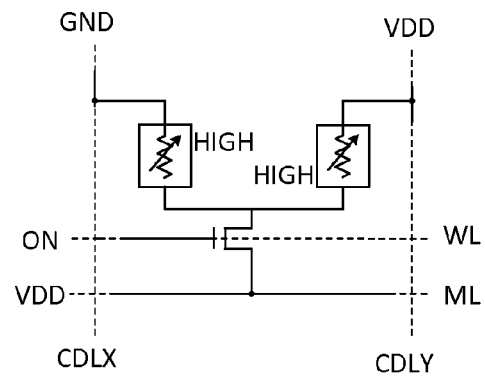

FIGS. 6A-6C are block diagrams showing example search operations of a memory cell. The memory cells shown in FIGS. 6A-6C can be implemented as a ternary content addressable memory similar to some of the embodiments shown and described above with reference to FIGS. 3A-3C. Referring to FIG. 6A, the memory cell can store data having a bit value of "0", for example, with a combination of a first memory element set in a high resistive state (shown in the left in FIG. 6A) and a second memory element set in a low resistive state (shown in the right in FIG. 6A). During a search operation, the matchline ML can be charged to a preset voltage level, such as $V_{dd}$, the compare datalines CDLX and CDLY can provide voltages to the memory cell that correspond to a portion of a search word having a bit value of "0", and a voltage on a wordline WL can be set to turn on a switching device electrically coupling the memory elements to the matchline ML. In some embodiments, the voltage on the compare dataline CDLX can be set to ground voltage GND and the voltage on the compare dataline CDLY can be set to the preset voltage $V_{dd}$ in order to indicate the portion of the search word has a bit value of "0". Based on the voltages of the matchline ML and the compare datalines CDLX and CDLY, and the resistance values of the first and second memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Although the matchline ML and the compare dataline CDLX are shown being set to different voltage levels, since the first memory element is set to a high resistive state, the current flow through the first memory element can be sufficiently low to not discharge the matchline beyond a threshold level to indicate a mismatch. Further, since the matchline ML and the compare dataline CDLY are shown being set to substantially the same voltage level, any current passing through the second memory element may not be sufficient to discharge the voltage level of the matchline ML beyond the threshold level to indicate a mismatch.

In some embodiments, when more than two memory elements couple to the matchline ML through same switching device, there can be potential sneak leakage path through the second memory element set in the low resistive state. For example, when one of the other memory elements coupled to the matchline ML through same switching device is mismatched and attempting to discharge the matchline ML, a voltage difference across the second memory element set in the low resistive state can induce a current flow towards the matchline ML, which can inadvertently charge the matchline ML. By including a non-linear devices (not shown), such as a diode or other device having non-linear electrical characteristics, in series with first and second memory element can help prevent the current flow towards the matchline ML through the sneak leakage path.

Referring to FIG. 6B, the memory cell can store data having a bit value of "1", for example, with a combination of a first memory element set in a low resistive state (shown in the left in FIG. 6B) and a second memory element set in a high resistive state (shown in the right in FIG. 6B). During a search operation, the matchline ML can be charged to a preset voltage level, such as $V_{dd}$, the compare datalines CDLX and CDLY can provide voltages to the memory cell that correspond to a portion of a search word having a bit value of "0", and a voltage on a wordline WL can be set to turn on a switching device electrically coupling the memory elements to the matchline ML. In some embodiments, the voltage on the compare dataline CDLX can be set to ground voltage GND and the voltage on the compare dataline CDLY can be set to the preset voltage $V_{dd}$ in order to indicate the portion of the search word has a bit value of "0".

When there is a voltage difference across a memory element set in a low resistive state, a voltage level on the matchline ML can discharge or reduce in magnitude beyond a threshold level to indicate a mismatch between the portion of the search word and the data value by the memory cell. Since the first memory element is shown as being set to a low resistive state, a voltage difference between the matchline ML and the compare dataline CDLX can initiate a current flow that discharges the voltage level on matchline ML beyond the threshold level that indicates a mismatch between the portion of the search word and the data stored by the memory cell. After the search operation has been performed, the voltage on the wordline WL can transition to a lower level to turn off the switching device.

Referring to FIG. 6C, the memory cell can store data having a bit value of "data mask," for example, with a combination of a first memory element set in a high resistive state (shown in the left in FIG. 6C) and a second memory element set in a high resistive state (shown in the right in FIG. 6C). During a search operation, the matchline ML can be charged to a preset voltage level, such as $V_{dd}$, the compare datalines CDLX and CDLY can provide voltages to the memory cell that correspond to a portion of a search word having a bit value of "0", and a voltage on a wordline WL can be set to turn on a switching device electrically coupling the memory elements to the matchline ML. In some embodiments, the voltage on the compare dataline CDLX can be set to ground voltage GND and the voltage on the compare dataline CDLY can be set to the preset voltage $V_{dd}$ in order to indicate the portion of the search word has a bit value of "0".

Based on the voltages of the matchline ML and the compare datalines CDLX and CDLY, and the resistance values of the first and second memory elements, the voltage level of the matchline ML can indicate a match between the portion of the search word and the data value by the memory cell. For example, since the first and second memory elements are both shown as being set to a high resistive state, the current flow through either of the first and/or second memory elements can be sufficiently low to not discharge the matchline ML beyond a threshold level to indicate a mismatch. After the search operation has been performed, the voltage on the wordline WL can transition to a lower level to turn off the switching device.

Although FIG. 6B shows the matchline ML being charged and then discharged in response to a mismatch between the voltage level on the compare datalines CDLX and CDLY and stored data, in some embodiments, the matchline can be charged to a low level and pulled to a high level in response to a mismatch.

Figure 7A:
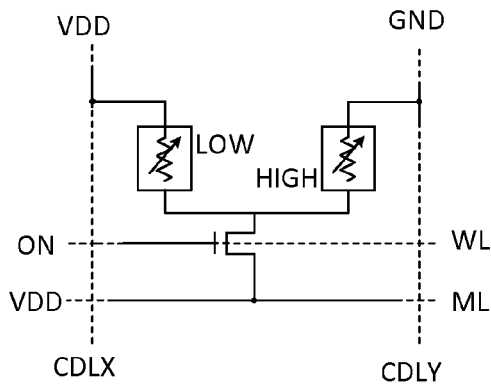
FIGS. 7A, 7B, 7C are block diagrams showing example search operations for a memory cell, e.g., as shown in FIG. 3A.
Figure 7B:
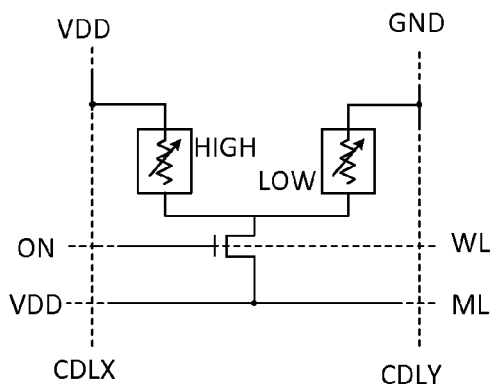
Figure 7C:
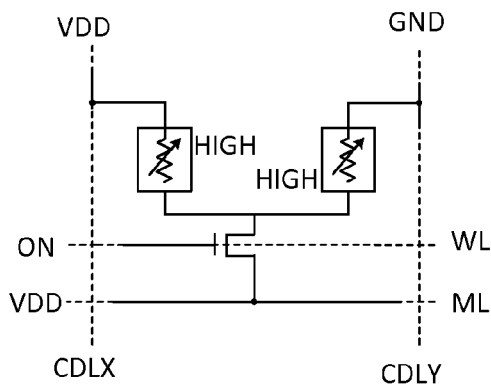

FIGS. 7A-7C are block diagrams showing example search operations of a memory cell. The memory cells shown in FIGS. 7A-7C can be implemented as a ternary content addressable memory similar to some of the embodiments shown and described above with reference to FIGS. 3A-3C. Referring to FIG. 7A, the memory cell can store data having a bit value of "1", for example, with a combination of a first memory element set in a low resistive state (shown in the left in FIG. 7A) and a second memory element set in a high resistive state (shown in the right in FIG. 7A). During a search operation, the matchline ML can be charged to a preset voltage level, such as $V_{dd}$, the compare datalines CDLX and CDLY can provide voltages to the memory cell that correspond to a portion of a search word having a bit value of "1", and a voltage on a wordline WL can be set to turn on a switching device electrically coupling the memory elements to the matchline ML. In some embodiments, the voltage on the compare dataline CDLX can be set to the preset voltage $V_{dd}$ and the voltage on the compare dataline CDLY can be set to the ground voltage GND in order to indicate the portion of the search word has a bit value of "1". Based on the voltages of the matchline ML and the compare datalines CDLX and CDLY, and the resistance values of the first and second memory elements, the voltage level of the matchline ML can indicate a match between the portion of the search word and the data value by the memory cell. After the search operation has been performed, the voltage on the wordline WL can transition to a lower level to turn off the switching device.

Since the matchline ML and the compare dataline CDLX are shown being set to substantially the same voltage level, any current passing through the first memory element may not be sufficient to discharge the voltage level of the matchline ML beyond a threshold level to indicate a mismatch. Although the matchline ML and the compare dataline CDLY are shown being set to different voltage levels, since the second memory element is set to a high resistive state, the current flow through the second memory element can be sufficiently low to not discharge the matchline beyond the threshold level to indicate a mismatch.

Referring to FIG. 7B, the memory cell can store data having a bit value of "0", for example, with a combination of a first memory element set in a high resistive state (shown in the left in FIG. 7B) and a second memory element set in a low resistive state (shown in the right in FIG. 7B). During a search operation, the matchline ML can be charged to a preset voltage level, such as $V_{dd}$, the compare datalines CDLX and CDLY can provide voltages to the memory cell that correspond to a portion of a search word having a bit value of "1", and a voltage on a wordline WL can be set to turn on a switching device electrically coupling the memory elements to the matchline ML. In some embodiments, the voltage on the compare dataline CDLX can be set to the preset voltage $V_{dd}$ and the voltage on the compare dataline CDLY can be set to the ground voltage GND in order to indicate the portion of the search word has a bit value of "1".

When there is a voltage difference across a memory element set in a low resistive state, a voltage level on the matchline ML can discharge or reduce in magnitude beyond a threshold level to indicate a mismatch between the portion of the search word and the data value by the memory cell. Since the second memory element is shown as being set to a low resistive state, a voltage difference between the matchline ML and the compare dataline CDLY can initiate a current flow that discharges the voltage level on matchline ML beyond the threshold level that indicates a mismatch between the portion of the search word and the data stored by the memory cell. After the search operation has been performed, the voltage on the wordline WL can transition to a lower level to turn off the switching device.

Referring to FIG. 7C, the memory cell can store data having a bit value of "data mask", for example, with a combination of a first memory element set in a high resistive state (shown in the left in FIG. 7C) and a second memory element set in a high resistive state (shown in the right in FIG. 7C). During a search operation, the matchline ML can be charged to a preset voltage level, such as $V_{dd}$, the compare datalines CDLX and CDLY can provide voltages to the memory cell that correspond to a portion of a search word having a bit value of "1", and a voltage on a wordline WL can be set to turn on a switching device electrically coupling the memory elements to the matchline ML. In some embodiments, the voltage on the compare dataline CDLX can be set to the preset voltage $V_{dd}$ and the voltage on the compare dataline CDLY can be set to the ground voltage GND in order to indicate the portion of the search word has a bit value of "1".

Based on the voltages of the matchline ML and the compare datalines CDLX and CDLY, and the resistance values of the first and second memory elements, the voltage level of the matchline ML can indicate a match between the portion of the search word and the data value by the memory cell. For example, since the first and second memory elements are both shown as being set to a high resistive state, the current flow through either of the first and/or second memory elements can be sufficiently low to not discharge the matchline ML beyond a threshold level to indicate a mismatch. After the search operation has been performed, the voltage on the wordline WL can transition to a lower level to turn off the switching device.

Although FIG. 7B shows the matchline ML being charged and then discharged in response to a mismatch between the voltage level on the compare datalines CDLX and CDLY and stored data, in some embodiments, the matchline can be charged to a low level and pulled to a high level in response to a mismatch.

Figure 8A:
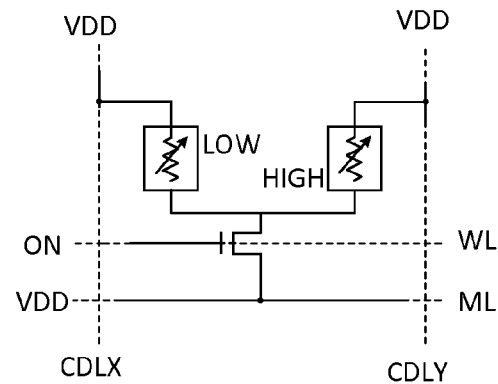
FIGS. 8A, 8B, 8C are block diagrams showing example search operations for a memory cell, e.g., as shown in FIG. 3A.
Figure 8B:
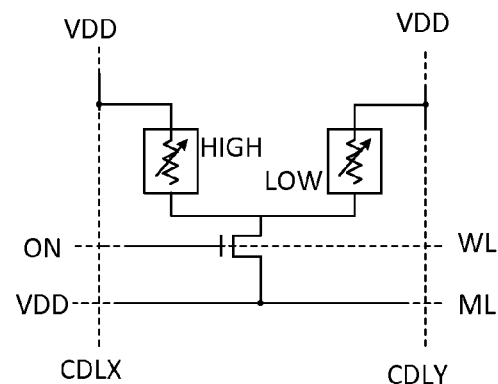
Figure 8C:
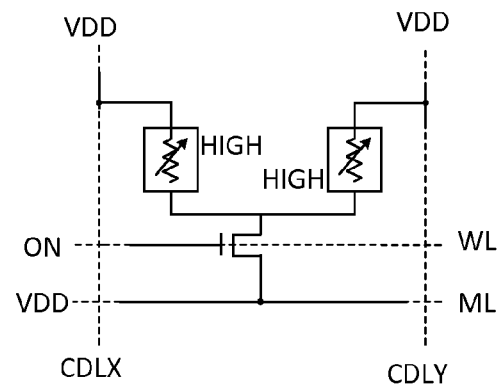

FIGS. 8A-8C are block diagrams showing example search operations of a memory cell. The memory cells shown in FIGS. 8A-8C can be implemented as a ternary content addressable memory similar to some of the embodiments shown and described above with reference to FIGS. 3A-3C. Referring to FIGS. 8A-8C, the memory cell can store data having a bit value of "0" in FIG. 8A, can store data having a bit value of "1" in FIG. 8B, and can store data having a bit value of "data mask" in FIG. 8C. During a search operation, the matchline ML can be charged to a preset voltage level, such as $V_{dd}$, the compare datalines CDLX and CDLY can provide voltages to the memory cell that correspond to a "compare mask," and a voltage on a wordline WL can be set to turn on a switching device electrically coupling the memory elements to the matchline ML. In some embodiments, the voltages on the compare datalines CDLX and CDLY can be set to the preset voltage $V_{dd}$ in order to implement the "compare mask." Since the preset voltage $V_{dd}$ on the compare datalines CDLX and CDLY can be substantially the same as the preset voltage level $V_{dd}$ on the matchline ML, little to no current passes through the first and second memory elements regardless of their respective resistive states. Thus, the matchline ML does not discharge, and instead indicates a match regardless of the data stored in the memory cells. After the search operation has been performed, the voltage on the wordline WL can transition to a lower level to turn off the switching device.

FIGS. 9A-9C are block diagrams showing views of an example array of memory cells 901 that can be used in a content addressable memory. Referring to FIGS. 9A and 9B, an array of memory cells 901 is shown in two cross-sectional views. The array of memory cells 901 includes switching devices SW0 and SW1 formed on a semiconductor substrate 903. In some embodiments, the switching devices SW0 and SW1 can be p-type metal-oxide-semiconductor (PMOS) transistors having source regions coupled to different subsets of memory cells disposed vertically above the transistors, drain regions coupled to matchlines ML0 and ML1, respectively, and gate regions coupled to wordlines WL0 and WL1, respectively. The different subsets of memory cells can each couple to compare datalines CDLX0 and CDLY0.

The eight compare data lines CDLX0 and CDLY0 can be used in pairs or sets to create four distinct combinations and provide four different matches, e.g., similar to the compare data lines shown and described above in FIG. 3C. Although FIGS. 9A and 9B show four layers of memory cells vertically disposed above the switching devices SW0 and SW1 with four sets of compare datalines CDLX0 and CDLY0, in some embodiments, any number of memory cells can be disposed above the switching devices SW0 and SW1. Further, with each additional layer of memory cells stacked above the switching devices SW0 and SW1, the effective memory cell size reduces. For example, when there is one layer of memory cells above the switching devices SW0 and SW1, the effective cell size can be $8F^2$, where F is the minimum feature size on the substrate 903. When there are 8 layers of memory cells above the switching devices SW0 and SW1, the effective cell size can be $1F^2$, where F is the minimum feature size on the substrate 903. When there are 16 layers of memory cells above the switching devices SW0 and SW1, the effective cell size can be $0.5F^2$, where F is the minimum feature size on the substrate 903.

Referring to FIG. 9C, a top view of an array of memory cells 911 is shown. The array of memory cells 911 can include multiple switching devices, such as switching devices SW0 and SW1, formed in a substrate 913. The switching devices can have their gate regions coupled to wordlines WL0-WL6 and have their source regions coupled to memory cells in the array 911. The array of memory cells 911 can include multiple memory elements, such as memory element 919, comprising a switching material 917 coupled between vertical trace lines 915 and compare datalines CDLX0, CDLY0, CDLX1, and CDLY1. In some embodiments, the switching material 917 can include any device where different states are represented by different resistances, such as RRAM, MRAM, PCRAM, or other structures, as they are variously known in the industry. The vertical trace lines 915 can be coupled between the switching devices and the memory cells in the array 911, for example, the vertical trace lines 915 can be formed vertically over the switching devices formed on the substrate 913. The compare datalines CDLX0, CDLY0, CDLX1, and CDLY1 can allow memory cells in a common row of the array 911 to work together to perform single bit or multibit matching operations, while the wordlines WL0-WL6 can allow memory cells in multiple adjacent rows to work together to perform multibit matching operations.

In some embodiments, the footprint of a memory element 919 can be substantially half of the footprint of a switching device SW0 or SW1. When the array of memory cells 911 is configured as a ternary content addressable memory, each memory cell can comprise two memory elements, providing an effective memory cell size for the content addressable memory equal to or less than the footprint of the switching device SW0 or SW1 depending on a number of layers of memory cells are disposed above the switching devices SW0 and SW1.

FIG. 10 is a block diagram example showing a side view of an example array of memory cells 1001 that can be used in a content addressable memory. Referring to FIG. 10, the array of memory cells 901 includes a switching device SW0 formed on a semiconductor substrate 1003. In some embodiments, the switching device SW0 can be p-type metal-oxide-semiconductor (PMOS) transistor having a source region coupled to memory cells via a trace line 1005, a drain region coupled to a matchline ML0, and a gate region coupled to a wordline WL0. The compare datalines CDLX and CDLY can be formed on an upper surface of the memory cells 1007. In some embodiments, the switching device SW0 and the memory cells 1007 can be formed in a common plane over the substrate 1003, including over portions of circuitry that are not part of the memory core.

FIG. 11 is a flow chart illustrating an example process for using a memory cell. In a block 1110, data can be stored in multiple memory elements using a plurality of resistive states. To provide a search function, per blocks 1120, 1130 and 1140, the matchline can be set to a first voltage level, compare datalines can be set to voltages corresponding to a portion of a search word, and a single transistor can be activated to couple the multiple memory elements to the matchline. The coupling of the multiple memory elements to the matchline can allow for a reduction in the first voltage level of the matchline to a second voltage level based on at least one of the voltages of the compare datalines or the resistive state of the memory elements. For example, when there is a voltage difference between the first voltage level on the matchline and at least one of the voltages on the compare datalines, a current can flow through the corresponding memory element with a magnitude relative to a resistive state of the corresponding memory element. Thus, when the resistive state of the corresponding memory element is set to a low resistive level, the current flow can be large enough to discharge the matchline down to the second voltage level. The memory device that includes the memory cell can determine that the portion of the search word provided to the memory elements does not match the data stored by the memory elements when the matchline drops to the second voltage level; otherwise, the memory device can determine that the portion of the search word provided to the memory elements matches the data stored by the memory elements.

Figure 12A:
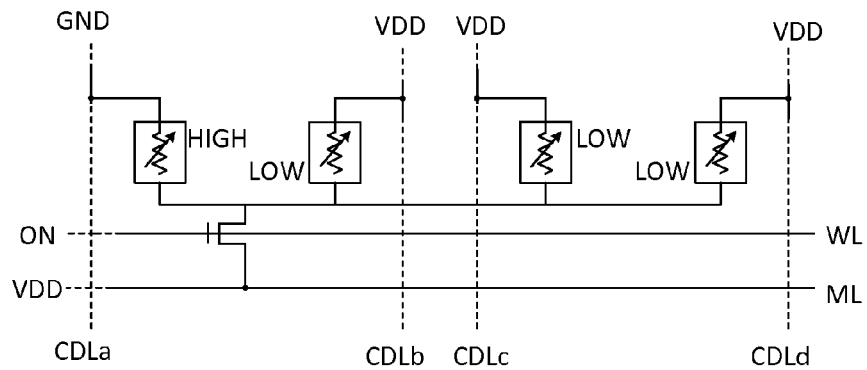
FIGS. 12A-12I are block diagrams showing example search operations for a memory cell using one-hot encoding.

FIGS. 12A-12I are block diagrams showing example search operations for a memory cell using one-hot encoding. Referring to FIG. 12A, the memory cell can have four resistive memory elements, which can be encoded according to a one-hot encoding scheme. For one-hot encoding scheme the data written into the memory elements can be represented by the resistance states of the memory elements as follows:

TABLE 2

| Memory Elements | | | | |
|---|---|---|---|---|
| 1 | 2 | 3 | 4 | Bit Value |
| High | Low | Low | Low | 00 |
| Low | High | Low | Low | 01 |
| Low | Low | High | Low | 10 |
| Low | Low | Low | High | 11 |
| High | High | Low | Low | 0x |
| High | Low | High | Low | x0 |
| Low | High | Low | High | x1 |
| Low | Low | High | High | 1x |
| High | High | High | High | xx |

FIG. 12A shows memory elements storing data having a bit value of "00", for example, with a combination of a first memory element set in a high resistive state (shown in the left in FIG. 12A) and a second, third, and fourth memory elements set in a low resistive state (shown in the right in FIG. 12A). During a search operation, the matchline ML can be charged to a preset voltage level, such as $V_{dd}$, the compare datalines CDLa-CDLd can provide voltages to the memory cell that correspond to a portion of a search word having a bit value of "00", and a voltage on a wordline WL can be set to turn on a switching device electrically coupling the memory elements to the matchline ML. In some embodiments, the voltage on the compare dataline CDLa can be set to ground voltage GND and the voltages on the compare datalines CDLb-CDLd can be set to the preset voltage $V_{dd}$ in order to indicate the portion of the search word has a bit value of "00". Based on the voltages of the matchline ML and the compare datalines CDLa-CDLd, and the resistance values of the memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Although the matchline ML and the compare dataline CDLa are shown being set to different voltage levels, since the first memory element is set to a high resistive state, the current flow through the first memory element can be sufficiently low to not discharge the matchline ML beyond a threshold level to indicate a mismatch. Further, since the matchline ML and the compare datalines CDLb-CDLd are shown being set to substantially the same voltage level, any current passing through the second, third, and fourth memory elements may not be sufficient to discharge the voltage level of the matchline ML beyond the threshold level to indicate a mismatch.

In some embodiments, non-linear devices (not shown), such as a diode or other device having non-linear electrical characteristics, can be coupled between the transistor and the memory elements to help prevent the current flow towards the matchline ML through the sneak leakage path.

Figure 12B:
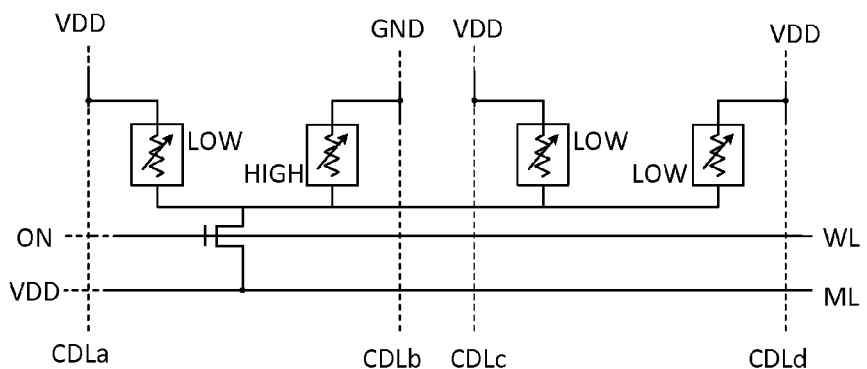

FIG. 12B shows memory elements storing data having a bit value of "01", for example, with a combination of a second memory element set in a high resistive state and a first, third, and fourth memory elements set in a low resistive state. During a search operation, the matchline ML can be charged to a preset voltage level, such as $V_{dd}$, the compare datalines CDLa-CDLd can provide voltages to the memory cell that correspond to a portion of a search word having a bit value of "01", and a voltage on a wordline WL can be set to turn on a switching device electrically coupling the memory elements to the matchline ML. In some embodiments, the voltage on the compare dataline CDLb can be set to ground voltage GND and the voltages on the compare datalines CDLa, CDLc, and CDLd can be set to the preset voltage $V_{dd}$ in order to indicate the portion of the search word has a bit value of "01". Based on the voltages of the matchline ML and the compare datalines CDLa-CDLd, and the resistance values of the memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Figure 12C:
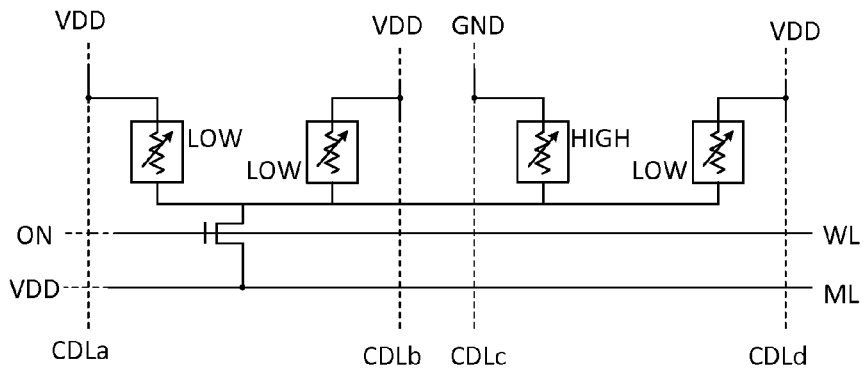

FIG. 12C shows memory elements storing data having a bit value of "10", for example, with a combination of a third memory element set in a high resistive state and a first, second, and fourth memory elements set in a low resistive state. During a search operation, the matchline ML can be charged to a preset voltage level, such as $V_{dd}$, the compare datalines CDLa-CDLd can provide voltages to the memory cell that correspond to a portion of a search word having a bit value of "10", and a voltage on a wordline WL can be set to turn on a switching device electrically coupling the memory elements to the matchline ML. In some embodiments, the voltage on the compare dataline CDLc can be set to ground voltage GND and the voltages on the compare datalines CDLa, CDLb, and CDLd can be set to the preset voltage $V_{dd}$ in order to indicate the portion of the search word has a bit value of "10". Based on the voltages of the matchline ML and the compare datalines CDLa-CDLd, and the resistance values of the memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Figure 12D:
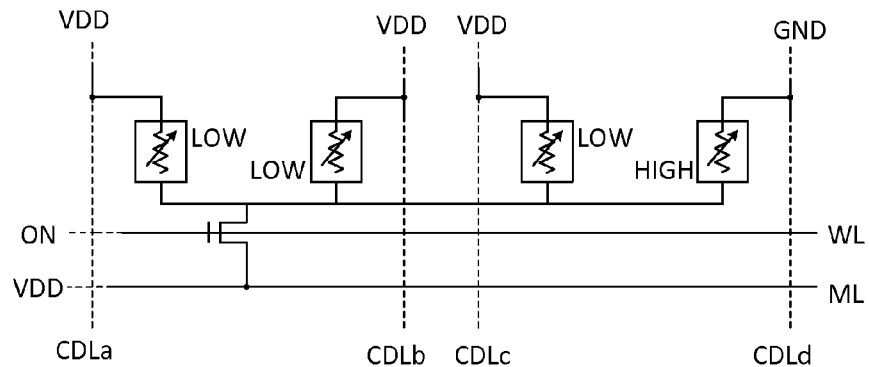

FIG. 12D shows memory elements storing data having a bit value of "11", for example, with a combination of a fourth memory element set in a high resistive state and a first, second, and third memory elements set in a low resistive state. During a search operation, the matchline ML can be charged to a preset voltage level, such as $V_{dd}$, the compare datalines CDLa-CDLd can provide voltages to the memory cell that correspond to a portion of a search word having a bit value of "11", and a voltage on a wordline WL can be set to turn on a switching device electrically coupling the memory elements to the matchline ML. In some embodiments, the voltage on the compare dataline CDLd can be set to ground voltage GND and the voltages on the compare datalines CDLa, CDLb, and CDLc can be set to the preset voltage $V_{dd}$ in order to indicate the portion of the search word has a bit value of "11". Based on the voltages of the matchline ML and the compare datalines CDLa-CDLd, and the resistance values of the memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Figure 12E:
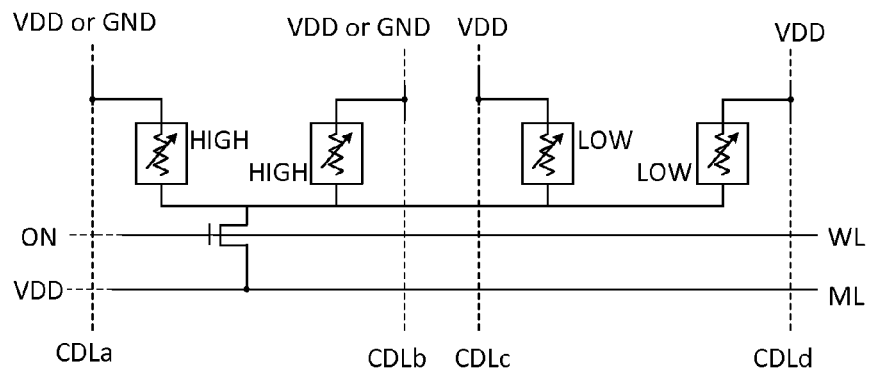

FIG. 12E shows memory elements storing data having a bit value of "0x", for example, with a combination of a first and a second memory elements set in a high resistive state and a third and a fourth memory elements set in a low resistive state. The "x" can be a don't care bit value, indicating that the memory elements can identify a match to search words "00" and "01".

During a search operation, the matchline ML can be charged to a preset voltage level, such as $V_{dd}$, the compare datalines CDLa-CDLd can provide voltages to the memory cell that correspond to a portion of a search word having a bit value of "00" or "01", and a voltage on a wordline WL can be set to turn on a switching device electrically coupling the memory elements to the matchline ML. Based on the voltages of the matchline ML and the compare datalines CDLa-CDLd, and the resistance values of the memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Figure 12F:
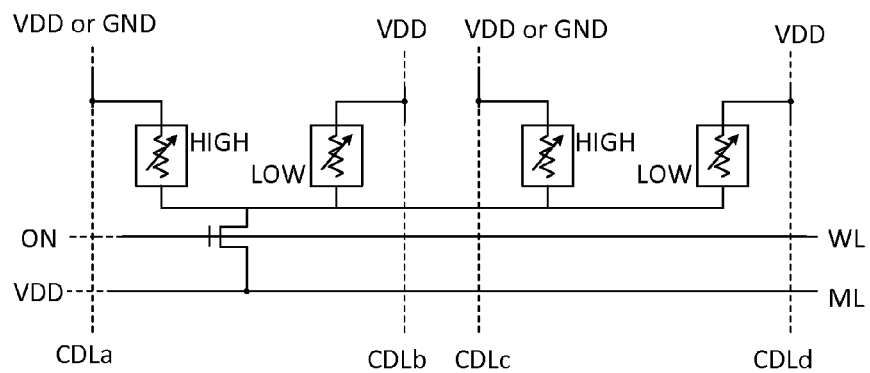

FIG. 12F shows memory elements storing data having a bit value of "x0", for example, with a combination of a first and a third memory elements set in a high resistive state and a second and a fourth memory elements set in a low resistive state. The "x" can be a don't care bit value, indicating that the memory elements can identify a match to search words "00" and "10".

During a search operation, the matchline ML can be charged to a preset voltage level, such as $V_{dd}$, the compare datalines CDLa-CDLd can provide voltages to the memory cell that correspond to a portion of a search word having a bit value of "00" or "10", and a voltage on a wordline WL can be set to turn on a switching device electrically coupling the memory elements to the matchline ML. Based on the voltages of the matchline ML and the compare datalines CDLa-CDLd, and the resistance values of the memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Figure 12G:
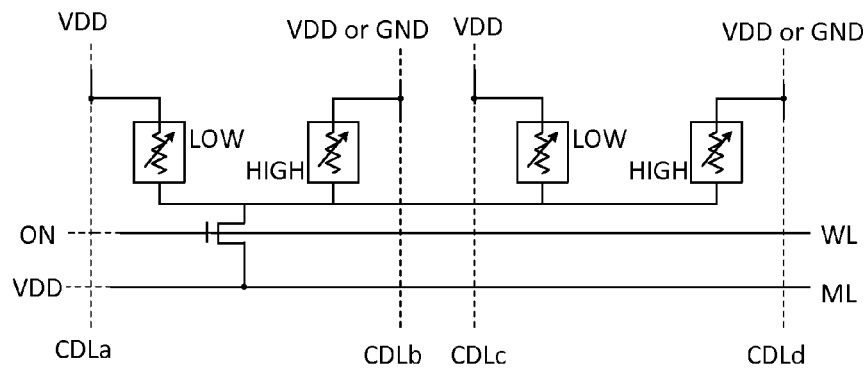

FIG. 12G shows memory elements storing data having a bit value of "x1", for example, with a combination of a second and a fourth memory elements set in a high resistive state and a first and a third memory elements set in a low resistive state. The "x" can be a don't care bit value, indicating that the memory elements can identify a match to search words "01" and "11".

During a search operation, the matchline ML can be charged to a preset voltage level, such as $V_{dd}$, the compare datalines CDLa-CDLd can provide voltages to the memory cell that correspond to a portion of a search word having a bit value of "01" and "11", and a voltage on a wordline WL can be set to turn on a switching device electrically coupling the memory elements to the matchline ML. Based on the voltages of the matchline ML and the compare datalines CDLa-CDLd, and the resistance values of the memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Figure 12H:
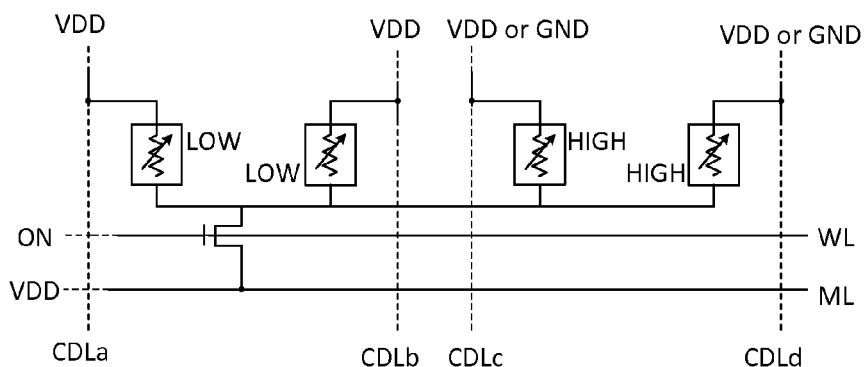

FIG. 12H shows memory elements storing data having a bit value of "1x", for example, with a combination of a third and a fourth memory elements set in a high resistive state and a first and a second memory elements set in a low resistive state. The "x" can be a don't care bit value, indicating that the memory elements can identify a match to search words "10" and "11".

During a search operation, the matchline ML can be charged to a preset voltage level, such as $V_{dd}$, the compare datalines CDLa-CDLd can provide voltages to the memory cell that correspond to a portion of a search word having a bit value of "10" and "11", and a voltage on a wordline WL can be set to turn on a switching device electrically coupling the memory elements to the matchline ML. Based on the voltages of the matchline ML and the compare datalines CDLa-CDLd, and the resistance values of the memory elements, the voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

Figure 12I:
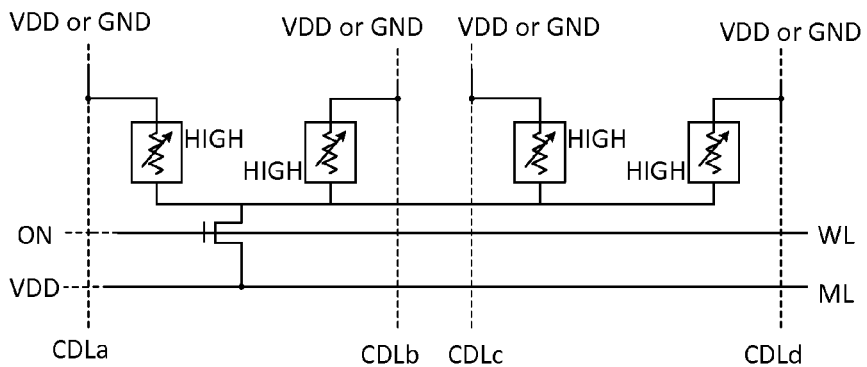

FIG. 12I shows memory elements storing data having a bit value of "xx", for example, where first through fourth memory elements are set in a high resistive state. The "xx" can be a don't care bit values, indicating that the memory elements can identify a match to search words "00", "01", "10", and "11".

During a search operation, the matchline ML can be charged to a preset voltage level, such as $V_{dd}$, the compare datalines CDLa-CDLd can provide voltages to the memory cell that correspond to a portion of a search word having a bit value of "00", "01", "10", and "11", and a voltage on a wordline WL can be set to turn on a switching device electrically coupling the memory elements to the matchline ML. The voltage level of the matchline ML can indicate a match between the portion of the search word and the data value by the memory cell. In some embodiments, the match between the portion of the search word and the data value by the memory cell can be indicated by a current on the matchline ML. After the search operation has been performed, the voltage on the wordline WL can transition to a lower level to turn off the switching device.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A content addressable memory array comprising a plurality of bitlines and a plurality of memory cell groups, each memory cell group comprising:
    a selection transistor; and
    multiple resistive memory devices, wherein each of the resistive memory devices includes:
        a first node coupled to a source node of the selection transistor; and
        a second node coupled to a respective one of the bitlines such that each resistive memory device in the group is coupled to a different bitline;
    wherein, in response to application of a word line to a gate node of the selection transistor, electrically coupling the second node to a matchline in a match mode.

2. The content addressable memory array of claim 1, wherein each memory cell group includes two resistive memory devices.

3. The content addressable memory array of claim 1, wherein the selection transistor is configured to in one state electrically couple the multiple resistive memory devices with the matchline, to allow in the match mode selective changes to a voltage level on the matchline based on the data stored by the multiple resistive memory devices and a search word provided to the multiple resistive memory devices on the respective bitlines.

4. The content addressable memory array of claim 3, wherein the voltage level on the matchline is configured by the selective changes to the voltage level of the matchline to indicate whether the search word matches the data stored by the multiple resistive memory devices.

5. The content addressable memory array of claim 3, wherein in the match mode a current on the matchline is configured to indicate whether the search word matches the data stored by the multiple resistive memory devices.

6. The content addressable memory array of claim 1, wherein the multiple resistive memory devices are formed in a common plane on a semiconductor substrate.

7. A device comprising:
multiple memory elements configured to store data based on a plurality resistive states; and
a selection transistor configured to in one state electrically couple the multiple memory elements with a matchline, to allow in a match mode selective changes to a voltage level on the matchline based on the data stored by the multiple memory elements and a search word provided to the multiple memory elements;
wherein each of the multiple memory elements includes:
a first terminal coupled to a corresponding dataline for providing a signal indicative of at least a subset of a search word; and
a second terminal coupled to a source terminal of the selection transistor; and
wherein, in response to application of a word line to a gate terminal of the selection transistor, electrically coupling the second terminal to the matchline in the match mode.

8. The device of claim 7, wherein the multiple memory elements comprises two memory elements.

9. The device of claim 7, wherein in the match mode the voltage level on the matchline is configured by the selective changes to the voltage level of the matchline to indicate whether the at least the subset of the search word matches the data stored by the multiple memory elements.

10. The device of claim 7, wherein in the match mode a current on the matchline is configured to indicate whether the at least the subset of the search word matches the data stored by the multiple memory elements.

11. The device of claim 7, wherein each of the multiple memory elements includes:
wherein, in response to the selection transistor electrically coupling the second terminal to the matchline in the match mode, a voltage difference between the matchline voltage at the start of the match mode and the dataline causes a voltage change on the matchline based on a resistive state of the memory element.

12. The device of claim 7, wherein the multiple memory elements are formed in one or more layers over the selection transistor formed on a semiconductor substrate.

13. A method comprising:
setting multiple datalines, each coupled respectively to a first terminal of one of multiple memory elements, with respective voltages corresponding to a search word, wherein the multiple memory elements are configured to store data with a plurality of resistive states;
electrically coupling a second terminal of the multiple memory elements to a source terminal of a common transistor;
electrically coupling the second terminal of the multiple memory elements to a matchline in response to application of a word line to a gate terminal of the common transistor in a match mode; and
determining whether the data stored by the multiple memory elements matches the search word based, at least in part, on a voltage level on the matchline measured after electrically coupling the second terminal of the multiple memory elements to the matchline.

14. The method of claim 13, wherein electrically coupling the multiple memory elements to the matchline allows for selective discharge of the voltage level on the matchline based on the data stored by the multiple memory elements and the respective voltages on the datalines.

15. The method of claim 14, wherein the voltage level on the matchline after electrically coupling the multiple memory elements to the matchline is configured to indicate whether the search word matches the data stored by the multiple memory elements.

16. The method of claim 14, wherein a current on the matchline after electrically coupling the multiple memory elements to the matchline is configured to indicate whether the search word matches the data stored by the multiple memory elements.

17. The method of claim 13, wherein determining whether the data stored by the multiple memory elements matches the search word is based on both the data stored by the multiple memory elements and the voltage difference between the voltage level on the matchline and the voltages on the datalines prior to electrically coupling the multiple memory elements to the matchline.

18. A device comprising:
a content addressable memory having an array of memory cells with first and second terminals, the memory cells arranged in a row-column format with each row of the memory cells coupling to a corresponding matchline through first memory cell terminals and each column of the memory cells coupled to a corresponding search line through second memory cell terminals, wherein each row of the memory cells includes multiple memory elements configured to store data based on a plurality of resistive states, the first memory cell terminal of each memory element in a row coupled to a corresponding transistor configured to selectively couple a plurality of the memory elements with the corresponding matchline for at least one row, and wherein the content addressable memory is configured to utilize the matchlines to indicate whether a search word placed on a subset of the search lines matches data stored by at least one row of the memory cells when the memory elements in the at least one row are electrically coupled to the corresponding matchlines.

19. The device of claim 18, wherein when the memory elements are electrically coupled to the corresponding matchlines, voltage levels on the matchlines selectively discharge based on the data stored by the multiple memory elements and the search word.

20. The device of claim 18, wherein the multiple memory elements are formed in multiple layers over the transistor formed on a semiconductor substrate, each layer having corresponding search lines.

* * * * *